United States Patent
Jeong

(10) Patent No.: US 6,711,217 B1
(45) Date of Patent: Mar. 23, 2004

(54) APPARATUS AND METHOD FOR LINEARIZED POWER AMPLIFICATION

(75) Inventor: Hyeong-tae Jeong, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/356,976

(22) Filed: Jul. 19, 1999

(30) Foreign Application Priority Data

Jul. 21, 1998 (KR) ............................................. 98-29195

(51) Int. Cl.[7] .............................. H04B 3/08; H03F 1/32
(52) U.S. Cl. ........................ 375/297; 375/296; 330/149
(58) Field of Search ................................ 375/296, 297, 375/57, 246, 247; 330/149, 151, 107, 129; 328/163, 155; 455/126, 127

(56) References Cited

U.S. PATENT DOCUMENTS

| | | | | |
|---|---|---|---|---|
| 4,462,001 A | * | 7/1984 | Girard | ........................ 330/149 |
| 5,905,760 A | * | 5/1999 | Schnabl et al. | ............. 375/296 |
| 5,949,283 A | * | 9/1999 | Proctor et al. | .............. 330/149 |

* cited by examiner

Primary Examiner—Stephen Chin
Assistant Examiner—Edith Chang
(74) Attorney, Agent, or Firm—Cha & Reiter, L.L.C.

(57) ABSTRACT

An apparatus and a method for eliminating distortion component from the output of power amplifier, comprising a baseband linearization arrangement for receiving the baseband signal, demodulating a distorted amplifier output signal, comparing the received baseband signal with the demodulated amplification output signal for providing a predistorted signal to remove the distorted component of the amplifier output signal applied by the power amplifier, and a carrierband linearization amplification arrangement for amplifying the output signal of the baseband linearization arrangement in order to linearize the distorted component of the amplifier output signal using the predistorted signal and for further linearizing the distorted component from the output of the power amplifier by extracting an error signal and amplifying the error signal to be combined the amplifier output signal in order to eliminate any distorted components in the amplifier output signal. The baseband linearization arrangemennt incorporates a pre-distortion linearization method for modulating the predistorted baseband signal into the carrierband linear-amplification system, and to which the carrierband linear-amplification system amplifies the modulated predistorted to achieve the first linearization of the distorted amplifier output signal by pre-calculating the predistorted signal to produce the linearized output signal, and thereafter, extracting only the error signal from the distorted amplifier output signal, amplifying the error to achieve the second linearization by combining the amplified error signal portion to the amplifier output signal.

24 Claims, 16 Drawing Sheets

APPARATUS AND METHOD FOR LINEARIZED POWER AMPLIFICATION

CLAIM OF PRIORITY

This application makes reference to, incorporates the same herein, and claims all benefits accruing under 35 U.S.C. §119 arising from an application entitled, APPARATUS AND METHOD FOR LINEARIZED POWER AMPLIFCATION, earlier filed in the Korean Industrial Property Office on Jul. 21, 1998, and there duly assigned Ser. No. 1998-029195.

FIELD OF THE INVENTION

The present invention relates to a linear power amplifier and a method for a linear power amplification. The apparatus and the method are particularly relates to a linear amplification suitable for use in a modulated digital radio frequency (RF).

BACKGROUND OF THE INVENTION

A digital telecommunication system is considered to be much more superior to an analog telecommunication system for producing a better voice quality and higher communication capacity. Typically, a mobile telecommunication system consists of a base station (BS) and a mobile telephone (MT) for linking subscribers' voice signals with the base station. At the base stations, the mobile telephone signals are transmitted to a mobile telephone via a mobile switching center (MSC). The base station uses a plurality of power amplifiers to generate a radio frequency (RF) signal at a specific level.

In order to use the limited frequencies, effectively, the digital telecommunication system uses a variable envelope modulation technology such as quadrature amplitude modulation (QAM) or quadrature phase shift keying (QPSK). Before being up-converted by a carrierband, the baseband signals pass through a pulse-shaping filter causing the baseband signals to be narrower frequency band. Then, these variable envelope signal waves pass through a non-linear power amplifier (NLPA) for amplification. However, the power amplifier employed in the communication system inherently distort its input signals as they are amplified. Thus, the amplification becomes a source of channel-to-channel interference in the adjoining channel and the distortions in the amplitude and phases of the output signals in the receiving-end. To combat such problem, numerous linearization techniques are developed to improve the performance of the non-linear power amplifier (NLPA).

Accordingly, few control techniques, e.g., feed-forward control loops and pre-distortion, have been developed to increase the linearity, i.e. reducing the error of amplifier systems. The feed-forward system includes subtracting a proportion of the power amplifier output signal from a proportion of the input signal to obtain an error signal, amplifying the error signal, and then subtracting the amplified error signal from the power amplifier output signal. That is, the feed-forward system amplifies analog RF signal on carrierband linearly by extracting only the distortion component from the power amplifier output signal making the distorted signals out of phase, amplifying the distorted signals, and then cancelling out the distorting components applied by the amplifier.

FIG. 1 represents a schematic diagram for known feed-forward linear amplification system. A carrierband signal inputted to the amplification system is supplied to a gain-phase regulator. The gain-phase regulator is made up of a variable attenuator (110) and a phase shifter (115) for regulating the gain and the phase of the carrierband signal. The output signal of the phase shifter (115) is inputted to a main amplifier (120), and the main amplifier (120) amplifies the inputted signal to a specific level and also generates distorted amplification signals. The distorted amplification signals from the main amplifier (120) are then outputted to a first delay means (130). At the same time, the carrierband input signal is inputted to a second delay means (140) via a divider (105). The second delay means (140) delays the received carrier input signals and transmits the delayed carrierband signals to a count-balancing means (145). The count-balancing means (145) combines the distorted amplification signal outputted from the main amplifier (120) with the carrierband input signal outputted from the second delay means, yielding a reverse distorted signal which has 180° phase difference in comparison to the output signal from the amplifier (120). The count-balancing means (145) extracts only the distorted signal component of the distorted signal from the main amplifier (120), and thereafter, the distorted signal component is amplified and then subtracted from the amplification output signals, to cancel out any distorting components applied by the amplifier.

Because the feed-forward system improves the inter-modulation signal distortion on the carrierband, another technique known as a pre-distortion is used to compensate distorted component from the output of the power amplifier on a baseband. The pre-distortion technique provides a pre-generated distortion component to the power amplifier. The pre-distortion technique involves demodulating an output signal of a non-linear power amplifier (NLPA), comparing the demodulated signal with an input signal prior to amplification, and then generating a pre-distorted signal to count-balance the magnitude and gain of distortion components of the amplified output signal. The pre-distorted signal is used to pre-distort the input signal on the baseband to yield undistorted amplified replica of the input signal of the power amplifier.

FIG. 2 represents a schematic diagram illustrating known pre-distortion technique. An input signal is transmitted to a power amplifier via a modem (210), a predistorter (220), and a first quad modulator (230). The amplifier generates an amplified output signal and transmits it to a transmission antenna (260). The first quad modulator (230) modulates the input signal using a local oscillating frequency outputted from a local oscillator (270). The amplified output signal from the output of the amplifier (240) passes through a band-pass filter (290) and supplied to a second quad modulator (280) The second quad modulator (280) demodulates the amplified output signal using the local oscillating frequency outputted from the local oscillator (270). The demodulated signal, Vf, is supplied to the predistorter (220). The predistorter compares the Vf and the input signal, Vi, of the amplifier to generate a pre-distorted signal, which compensates the distorted components of the amplified output signal and transmits the pre-distorted signal to the quad modulator (230). The compensation is made in manner in which the amplifier (240) will inherently pre-distort the input signal by amplifying that signal, thereby eliminating the generation of out-of-band components.

As shown in the prior arts, the feed-forward system and the pre-distortion system are developed to linearize the amplified signals on a carrierband and baseband in the analog and digital communication fields. So far, there have been no particular apparatus and method for eliminating the distortion components in the baseband and carrierband of the amplified output signal by incorporating these two techniques to be effectively used in a digital telecommunication system.

U.S. Pat. No. 5,155,448, "A distortion generator coupled between the input of the amplifier arrangement and the input of the main amplifier" discloses a method for combining the pre-distortion with the feed-forward technique used on a carrierband only. Thus, there is need to provide a system used in the digital communication system for eliminating the distortion components in the amplified analog signal on carrierband and amplified digital signal on the baseband.

SUMMARY OF THE INVENTION

One of the objects of the present invention is to solve the problem of prior art, and to provide an apparatus and a method for linearized power amplification suitable for use in both carrierband and baseband in the digital communication system.

An apparatus and a method for eliminating amplified distortion signal component includes a baseband linearization arrangement for receiving the baseband signal, demodulating a distorted amplifier output signal and comparing the received baseband signal with the demodulated amplifier output signal to generate a pre-distorted signal that can be used to pre-compensate the distorted component applied by a power amplifier, and also includes a carrierband linearization amplification arrangement for amplifying the pre-distorted signal from the baseband linearization arrangement to further linearize the distorted component of the amplifier output signal. The baseband linearization arrangement incorporates the pre-distortion linearization method for modulating the predistorted baseband signal into the carrierband linear-amplification system. The carrierband linear-amplification system amplifies the modulated pre-distorted signal to achieve the first linerization of the distorted component of the amplifier output signal by pre-calculating the predistorted signal to produce a linerized output signal. The carierband linear-amplification system also extracts an error signal from the distorted amplifier output signal, amplifies the error signal to achieve the second linerization by combining the amplified error signal portion to the amplifier output signal.

Other objects and advantages of the present invention will become apparent with reference to the following detailed description and the attached drawings.

DETAILED DESCRIPTION OF THE INVENTION

A preferred embodiment of the present invention will be described hereinbelow with reference to the accompanying drawings. In the following descriptions, numerous specific details are set forth to provide a more thorough understanding of the present invention. It will be apparent, however, to one skilled in the art that the present invention may be practiced without these specific details. In other instances, well known constructions or functions are not described in detail so as not to obscure the present invention.

A preferred embodiment of an apparatus for linearized power amplification according to the present invention includes a baseband linear arrangement and a carrierband linear amplification arrangement.

The baseband linear arrangement of the present invention supports a pre-distorted modulation method and provides a pre-distorted signal to estimate in the manner in which a non-linear power amplifier (NLPA) will inherently distort the amplifier input signal by amplifying that signal. The pre-distorted signal is derived by using knowledge of the non-linear input-output transformation to produce a modified amplifier input signal is produced to cancel out the distorted component of the amplifier output signal from the NLPA.

The carrierband linear amplification arrangement further eliminates the distorted component of the amplifier output signal by extracting only the distorted component generated in the NLPA, amplifying the extracted distorted component, and combining the amplifier output signal with the amplified distorted component to eliminate any distorting components applied by the NLPA in the carrier band.

Figure 1:
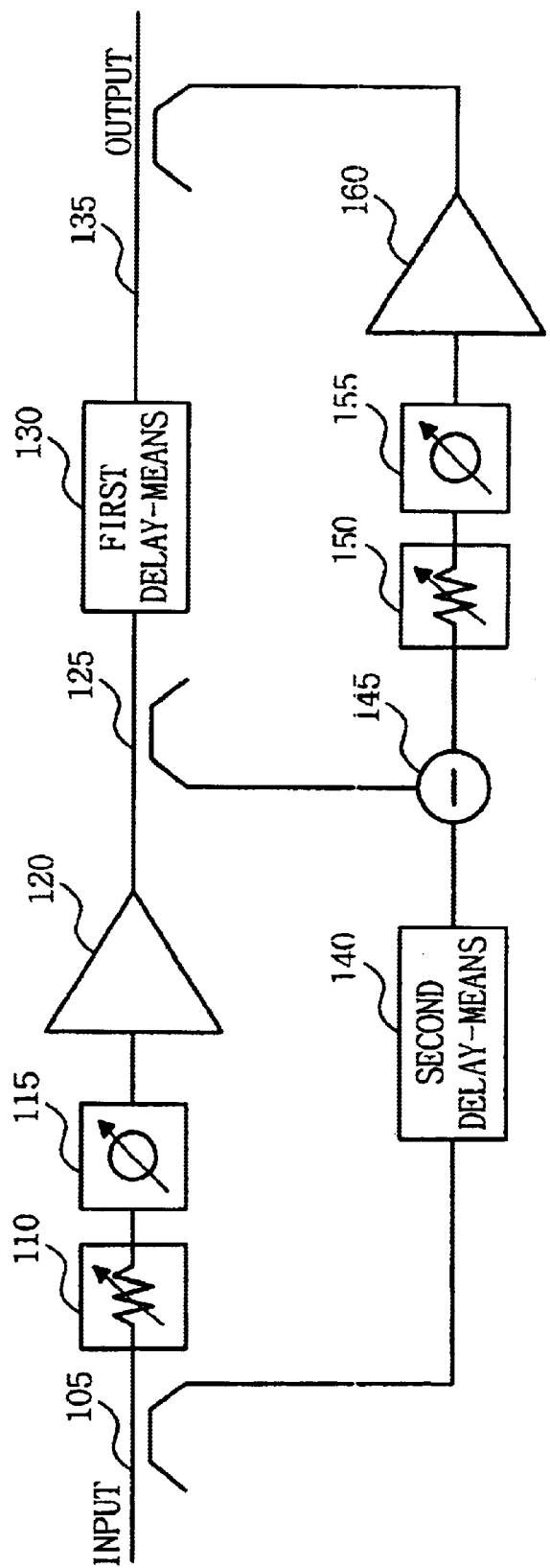
FIG. 1 shows a schematic diagram illustrating a feed-forward linear amplification system in accordance with a prior art.
Figure 2:
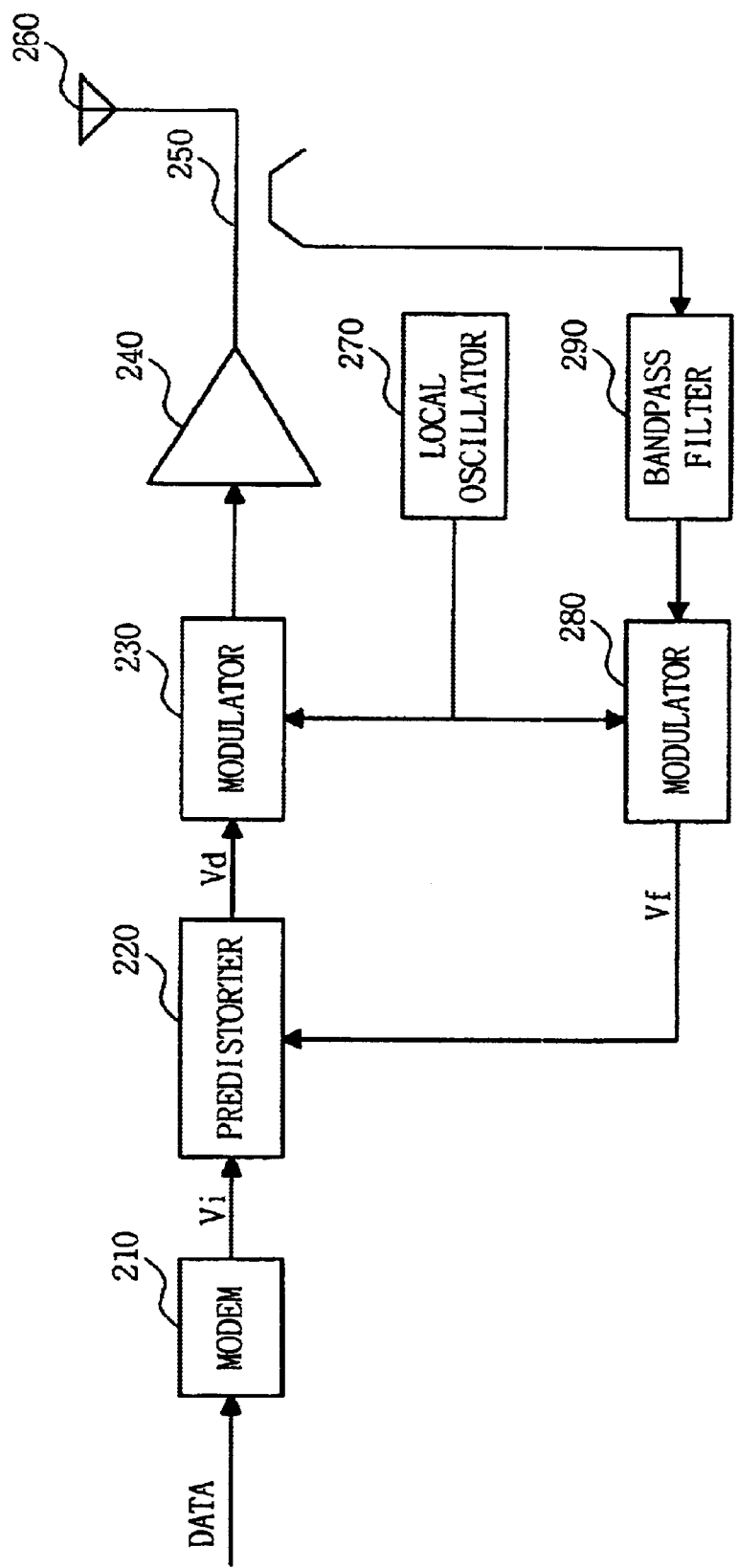
FIG. 2 shows the schematic diagram illustrating a pre-distortion linear amplification system in accordance with a prior art.
Figure 3:
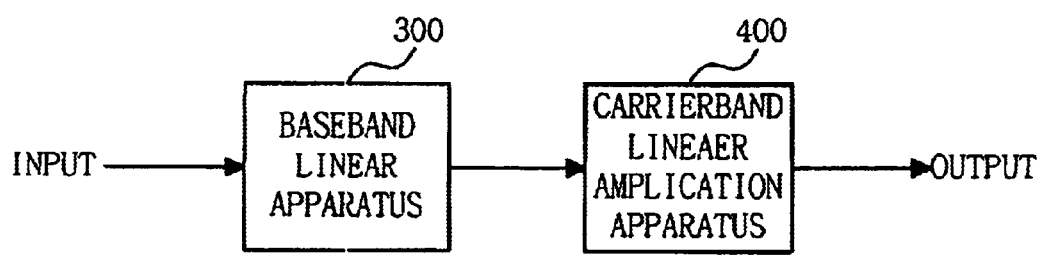
FIG. 3 shows the schematic diagram illustrating a linear amplification arrangement in accordance with the embodiment of the present invention.

FIG. 3 shows a schematic diagram of a linear amplification system in accordance with the present invention. As shown in the FIG. 3, the present invention is includes a baseband linear arrangement (300) and a carrierband linear amplification arrangement (400). The baseband linear arrangement (300) modulates the baseband signal inputted from a data source and simultaneously modulates a pre-distorted signal. The carrierband linear amplification arrangement (400) receives the predistorted signal from the baseband linear amplification arrangement (300), and performs the linearization.

The baseband linear amplification arrangement (300) demodulates the amplifier output signal from the carrierband linear amplification arrangement (400), compares the demodulated amplifier output signal with the input baseband signal to generate a predistorted signal to count-balance the distorted component of the amplifier output signal from the NLPA, and transmits the pre-distorted/modified signal to the carrierband linear amplification arrangement (400). First, the pre-distorted signal from the baseband linerization arrangement is linearized when the pre-distorted signal is amplified by the NLPA in the carrierband linear amplification arrangement (400). Secondly, the carrierband linear amplification arrangement (400) feed-backs the amplifier output signal to be compared with the predistorted input signal from the baseband linear amplification arrangement (300), amplifies only the distorted component included in the amplifier output signal, and then combines the amplified distorted output signal with the amplifier output signal to further linearizes any distorting components applied by the power amplifier. As a result of the first and second linearizations, the distorted components of the amplifier output signals applied by the amplification are eliminated.

Figure 4:
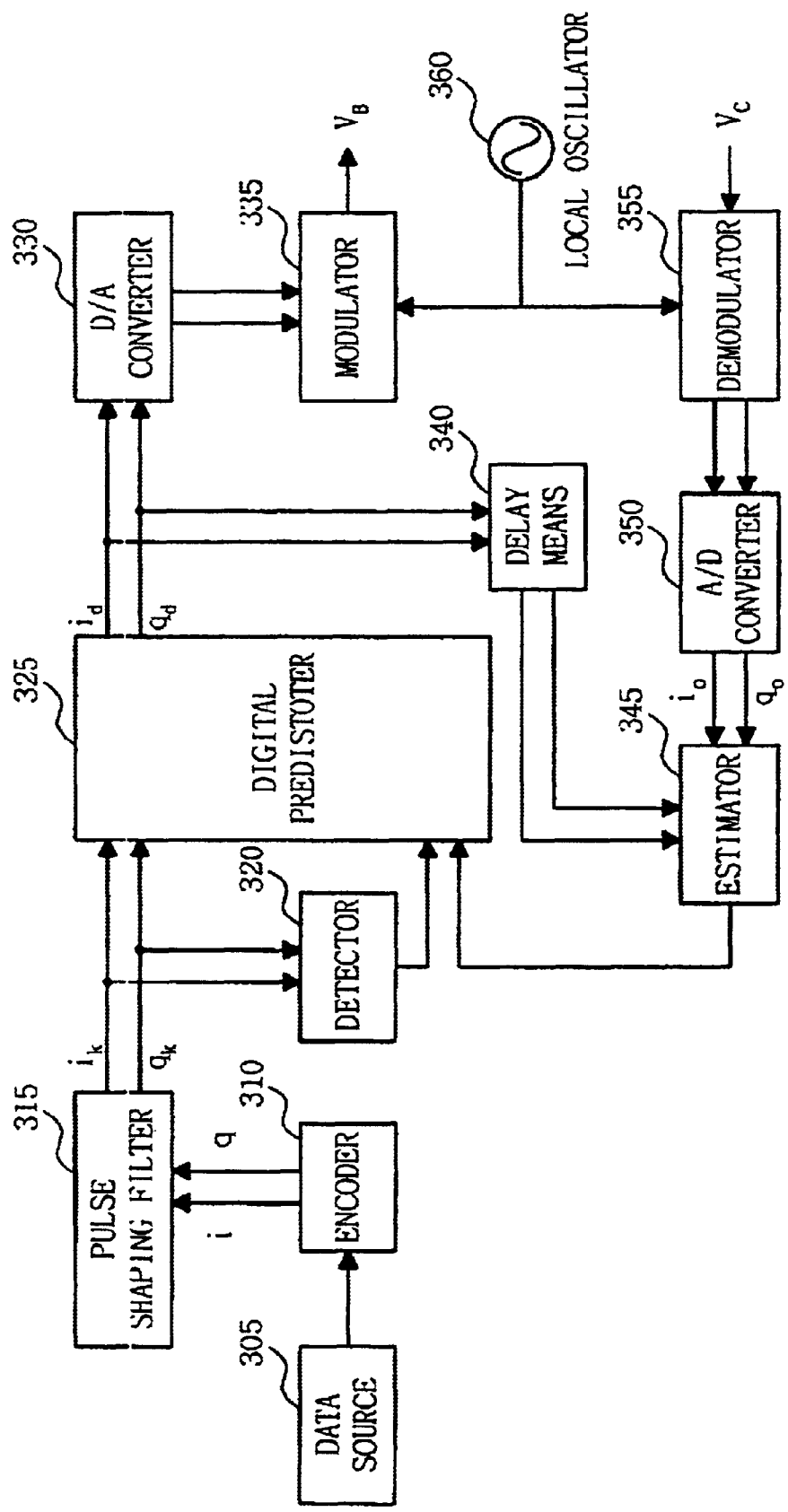
FIG. 4 shows the block diagram illustrating a baseband linear amplification system in accordance with the embodiment of the present invention.

FIG. 4 shows a block diagram of a baseband linear amplification arrangement in accordance with the present invention. As shown in the FIG. 4, it includes a data source (305) for providing a digital signal of the baseband; a quadrature-phase-shift-keying (QPSK) encoder (310) for modulating the digital signal; a pulse shaping filter (315) for pulsifying the encoded digital signal and for limiting the band; an absolute detector (320) for measuring an amplitude of filtered signal; a pre-distorter (325) for modifying the amplifier input signal by using the output signal from the absolute detector (320) and output signal from an amplitude modulation (AM-AM) and phase modulation (AM-PM) estimator (345); a digital-to-analog converter (D/A converter) (330) for converting the digital signal from the pre-distorter (325) into an analog signal; a first quad modulator (335) for up-converting the analog signal into a carrierband by using the local oscillating frequency signal outputted from a local oscillator (360) to transmit a baseband linearized signal $V_B$; a second quad demodulator (355) for down-converting the amplifier output signal, $V_C$, into analog signal using the local oscillating frequency signal from the local oscillator (330); a A/D converter (350) for converting the demodulated analog signal by the second quad demodulator (355) into digital signal; a second delay means (340) for delaying the output signal from the digital predistoter (325); the AM-AM and AM-PM estimator (345) for comparing the digital signal from the A/D converter (350) with the delayed digital signal outputted from the predistorter (325) and supplying the comparison value to the pre-distorter (325).

Figure 5:
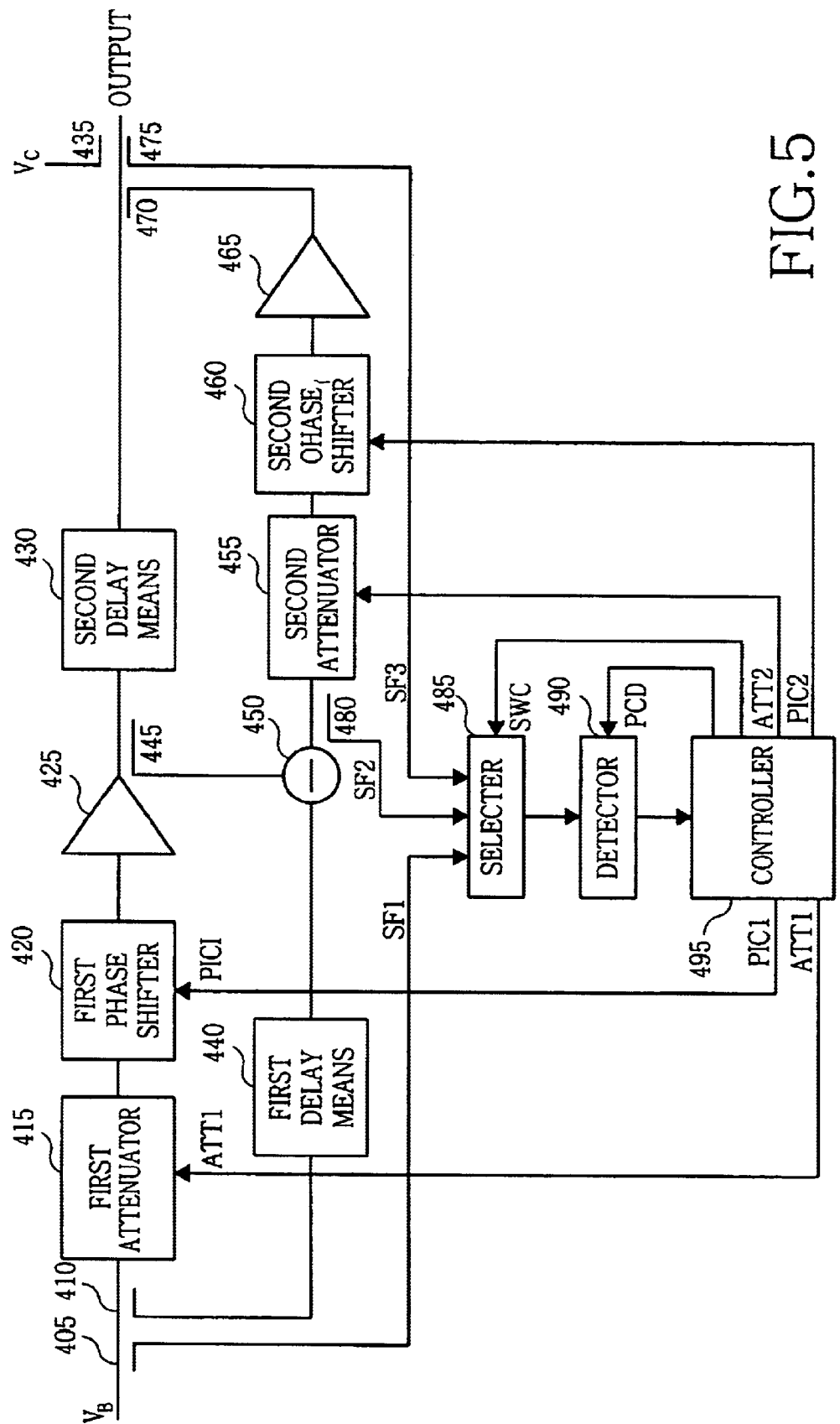
FIG. 5 shows the block diagram illustrating a carrierband linear amplification arrangement in accordance with the embodiment of the present invention.

FIG. 5 shows a block diagram illustrating a carrierband linear amplification arrangement in accordance with the present invention. As shown in the FIG. 5, it includes a first attenuator (415) for adjusting the voltage level of the pre-distorted digital signal from the baseband linear amplification arrangement (300) in response to a first attenuation value (ATT1); a first phase shifter (420) for phase-shifting the attenuated signal from the first attenuator (415) in response to a first phase value (PIC1); a main amplifier (425) for amplifying the phase-shifted signal from the first phase-shifter (420); a second delay means (430) for delaying the amplified output signal from the main amplifier (425); a first delay means (440) for delaying the baseband signal, $V_B$, which is provided via a second divider (410); a count-balancing means (450) for subtracting the output signal from the first delay means (440) from the main amplifier's output signal provided via a third divider (445) to provide an error signal; a second attenuator (455) for adjusting the voltage level of the output signal from the count-balancing means (450) in response to a second attenuation value (ATT2); a second phase shifter (460) for phase-shifting the attenuated signal from the second attenuator (455) in response to a second phase value (PIC2); an error amplifier (465) for amplifying the shifted signal from the second phase shifter; and, a combiner (470) for combining the amplified error signal with the output signal, Vc, to yield undistorted amplified replica of the amplifier input signal, and to cancel out all distorting components applied by the main amplifier (425).

The count-balancing means (450) simply extracts the distorted component of the amplifier output signal portion from the distorted amplifier output signal, the first attenuator (415) and the first phase shifter (420) regulate the magnitude of the predistorted input signal from the baseband linear amplification arrangement (300). Similarly, the second attenuator (455) and second phase shifter (460) regulates the magnitude of output signals from the count-balancing means (450).

The carrierband linear amplification arrangement (400) further includes a selector (485) for selecting one of three signals, wherein three signals are a first controlled signal (SF1) provided from the output signal ($V_B$) via the first divider (405), a second controlled signal (SF2) provided from the count-balancing means (450) output signal via a forth divider (480), and a third controlled signal (SF3) provided from the amplifier output signal ($V_C$) via a fifth divider (475); a detector (490) for converting the one of the three selected signal by the selector (485) into a direct current voltage value proportional to power; and a controller (495) for comparing with the each detected voltage values for generating the attenuation value (ATT1) for the first attenuator (415) and the attenuation value (ATT2) for the second attenuator (455), the phase value (PIC1) for the first phase shifter (420), and the phase value (PIC2) for the second phase shifter (460), and for generating a selection control signal (SWC) and a phase locked loop (PLL) control data (PCD) or a detection control signal.

The operational principle of the preferred embodiment of the present invention is as follows. First, referring to FIG. 4, the process of first linearization and modulation on baseband of the baseband linear arrangement (300) is described. In FIG. 4, a signal in the form of digital bit string is inputted to a data source (305) and passes through a QPSK encoder (310), which divides the input signal into the digital in-phase and quadrature-phase signals (hereinafter referred to as, i and q signals). These encoded i and q signals pass through a pulse shaping filter (315) and are outputted as digital pulsed signals ($i_k, q_k$). These digital pulsed signals ($i_k, q_k$) are passed through a digital predistorter (325), and outputted as predistorted signals ($i_d, q_d$).

The predistorted signals ($i_d, q_d$) pass through a D/A converter (330) for converting the digital signals ($i_d, q_d$) into analog signals, and then the converted analog signals are up-converted to carrierband by a local oscillator (360) and a quad modulator (335). The up-converted signal ($V_B$) are inputted to a main amplifier (NLPA) (425) of the baseband linear amplification arrangement (400) via a first attenuator (415) and a first phase shifter (420).

The main NLPA (425) amplifies the $V_B$ and generates $V_C$, which includes distorted component applied by the main NLPA (425). An estimator (345) in the baseband linearization arrangement compares the $V_B$ and $V_C$. The predistorter (325) generates a predistorted signal based on the comparison of $V_B$ and $V_C$ signals and outputs the predistorted signal as an up-converted signal, $V_B$, via the D/A converter (330) and the quad modulator (335). Thereafter, the main NLPA (425) amplifies the predistorted signal, $V_B$, at a time, to be linearized in sense that the output signal, $V_C$, is proportional to the input signal $V_B$ of the main NLPA (425).

Figure 6:
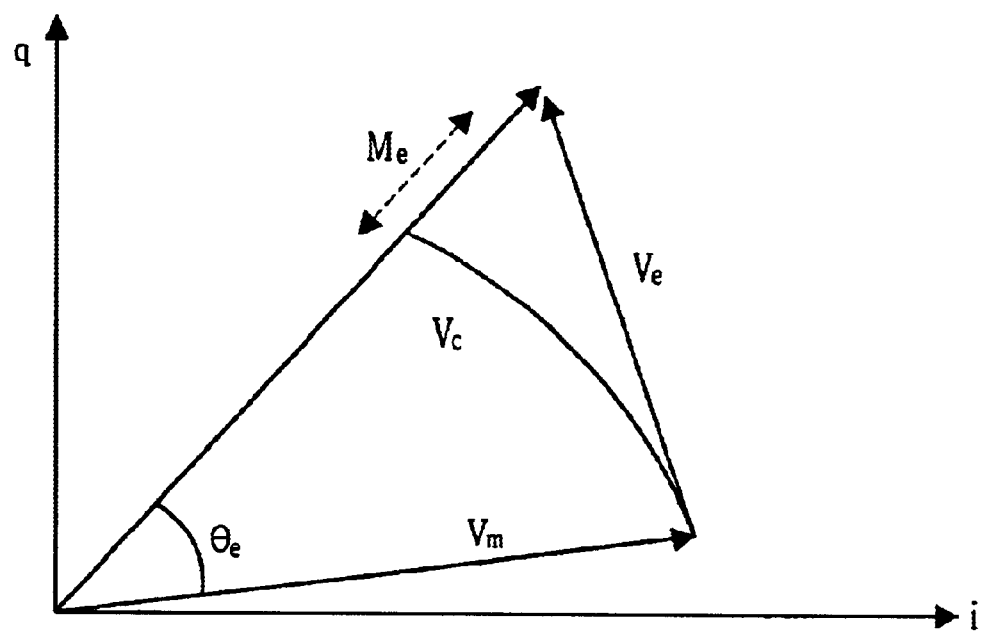
FIG. 6 is a vector diagram showing a typical AM-AM and AM-PM distortion of a non-linear power amplification (NLPA) of the present invention.

FIG. 6 is a vector diagram illustrating an AM-AM and AM-PM distortion of the non-linear power amplification (NLPA) in accordance with the present invention. As shown in the FIG. 6, the modulated vector of desired output is represented by $V_m$. However the distorted $V_c$ is caused by the distorted component $V_e$. A phase error by an amplification is represented as $\theta_e$ and a magnitude of accumulated error is represented as $M_e$.

In order to compensate the distorted component on the baseband, the quad demodulator (355) gets the output signal, $V_c$, via the sixth divider (435) and demodulates into I-phase signal and Q-phase signal using the local oscillator (360). These demodulated signals are outputted as digital signals ($i_o, q_o$) by the A/D converter (350). The estimator (345) compares the output ($i_o, q_o$) from the A/D converter (350) with the output signal from the predistortor (325) ($i_d, q_d$). However, it is necessary to equalize by a proper delay for being compared the ($i_d, q_d$) with the ($i_o, q_o$), and this is accomplished by the delay (340) which delays the output of ($i_d, q_d$) accordingly to equalizes with the output of ($i_o, q_o$).

After the equalization, the estimator (345) compares the ($i_d, q_d$) with the ($i_o, q_o$) and determines the distorted component, $V_e$. The digital predistorter (325), using a look-up table, generates a predistorted signal responsive to the distorted component, $V_e$, and the amplifier input signal to generate the digital signals ($i_d, q_d$). Using the output signal ($V_e$) provided from the estimator (345) and $|V_k|^2$ value provided from the absolute detector (320), the predistorter (325) calculates an address for the look-up table. Using the calculated address, the predistorter (325) generates the predistorted signal ($i_d, q_d$), which is used for removing non-linearity of the NLPA (425). To make easy on the calculation about the power level of the amplifier input signal applied to the predistorter for generating the predistorted signal, an absolute detector (320) provides the voltage magnitude of $|V_k^2|$, instead of $|V_k|$ for the output predistorted signal ($i_k, q_k$) to the predistorter (325). The predistorted signal outputted from the predistorter (325) is transmitted to the input of the NLPA at a time.

The look-up table which is used by the predistorter (325) include two types of look up table, one dimensional table or two dimensional table depending on what the relevant content of to be retrieved. That is, the look up table becomes one dimensional table in case of needing one value for finding corresponding comparable data, and becomes two dimensional table in case of needing two values for finding corresponding comparable data. One dimension look-up table is smaller in the amplitude (1/n) than the two-dimension look-up table (n×n).

FIG. 5 illustrates a linearized power amplification arrangement (400) for the carrierband. In order to eliminate the distorted component from the amplifier output signal on the carrierband, the $V_B$ outputted from the baseband linear arrangement (300) is inputted to the first attenuator (415) and the first phase shifter (420). The main NLPA (425) amplifies and the output signal from the first attenuator (415) and the first phase shifter (420). The $V_B$ is also inputted to the first delay means (440) via the second divider (410). The first delay means (440) delays the $V_B$ to adjust the delay time caused by the first phase shifter (420) and the main NLPA (425) so that the output signals from the main NLPA (425) and the output from the first delay means (440) are synchronized exactly. A third divider (445) extracts the distorted amplification signal by the main NLPA (425), and the count-balancing (450) subtracts the delayed signal output from the first delay means from the distorted amplification signal in order to generate an error signal applied by the main NLPA (425).

Figure 7:
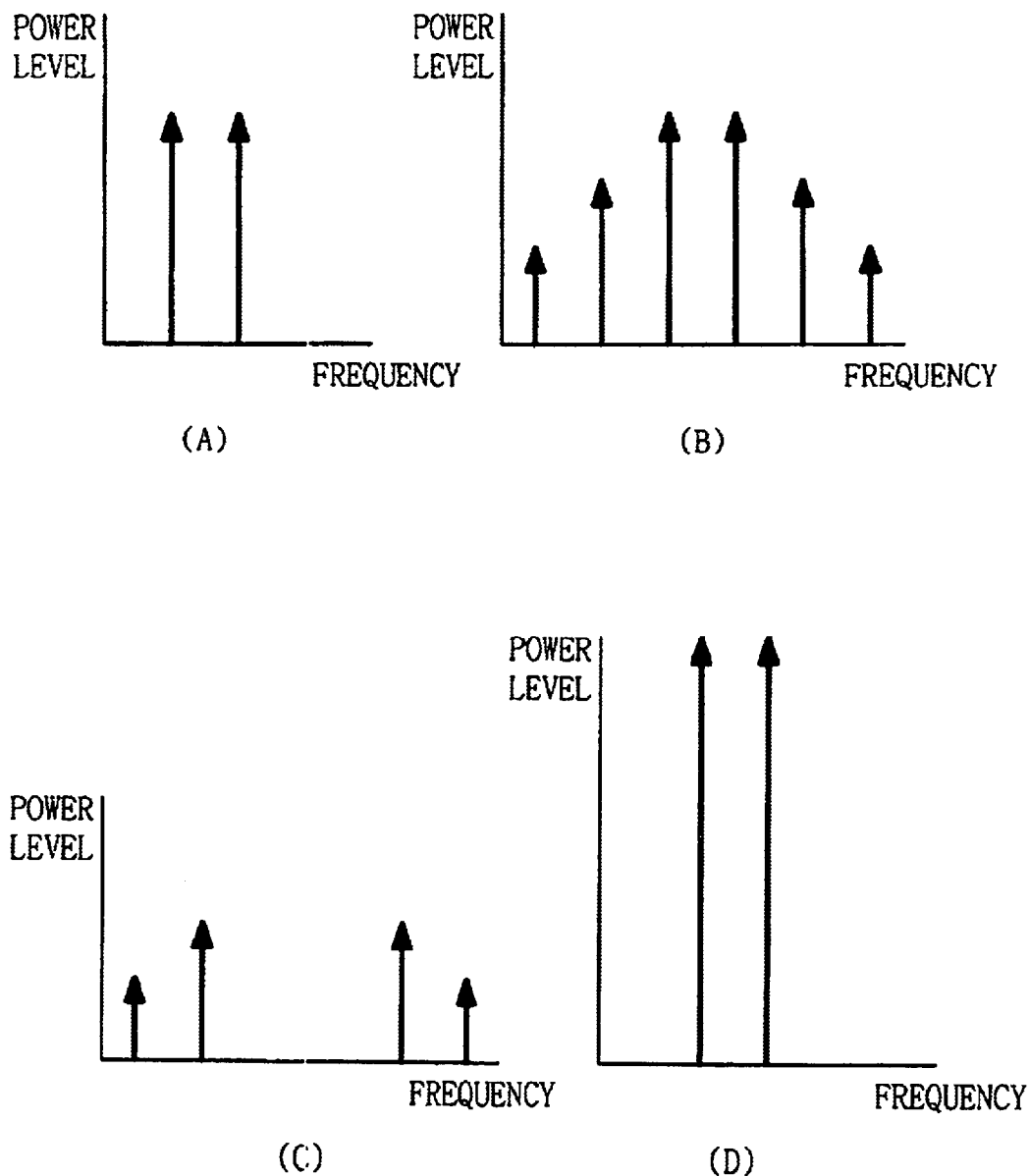
FIG. 7 shows a linear-amplified power spectrum by the linearized power amplification apparatus of the present invention.

FIG. 7 illustrates a linear amplification power spectrum by the linearized power amplification arrangement in accordance with the present invention. In the graph, (A), it shows the output signal, $V_B$, supplied to the carrierband linear amplification arrangement (400). The main NLPA (425) amplifies the carrierband signal and generates the signal including the distorted signal component as shown in the graph, (B). The count-balancing means (450) then subtracts signal (A) from the signal in (B) to extract the error signal as shown in the graph, (C). Finally, the undistorted carrierband signal outputted is illustrated in the graph (D) of the FIG. 7.

The count-balancing means (450) can be either a subtracter or a adder. FIG. 5 illustrates the count-balancing means as the subtracter, wherein the count-balancing means (450) receives two exactly equalized RF signals being out of phase. The count balancing means (450) inputs one of two signals as it is, and converts the other signal into out of phase. If a RF signal as shown in the graph (A) of FIG. 7 and the amplified RF signal as shown in the graph (B) of FIG. 7 are inputted to the count balance means (450), the in-phase components of RF signals will be converted into out of phase and subtracted from the passing carrierband to provide the distorted signal as shown in the graph (C) of FIG. 7.

Moreover, for removing the distorted component on the carrierband, the extracted error signal is amplified and reintroduced to be out of phase with the amplifier output signal. The extracted error signal component is sufficiently regulated to remove the distorted signal component from the main NLPA (425), by using the second attenuator (455) and the second phase shifter (465) in order to be accurately aligned with input signals prior to amplification by the main NALP (425). That is, the delays of the distorted amplification signal outputted from the main NLPA (425) and RF signal outputted from the first delay means (440) are preferably equalized exactly. Similarly, the amplitude levels and the phases of two RF signals, one from the third divider (445) and the other from the first delay means (440), inputted to the count balancing means (450) are exactly equalized using the first attenuator (415) and the first phase shifter (420), allowing the count balancing means (450) to extract the error signal. The first attenuator (415) adjusts the level of inputted RF signal in response the first attenuation value (ATT1). The first phase shifter (420) adjusts the phase of inputted RF signal in response to the first phase value (PIC1).

Since the adjusted values of the first attenuator (415) and the first phase shifter (420) do not remain constant over the full operating range of the power amplifier, the adjusted values of the first attenuator (415) and the first phase shifter (420) are controlled by a controller (495) to mange the full operation of the power amplifier, in order to properly eliminate the distortion components of the amplifier output signal. The controller outputs and provides a selection control signal (SWC) for selecting one of the signals received by a selector (485). The selector (485) serves to select either a first signal (SF1) from the first divider (405), a second signal (SF2) from the forth divider (480), or a third signal (SF3) from the fifth divider (475). The controller (495) also outputs and provides a signal, PCD, for controlling a detector (490). The detector (490) serves to provide a received signal strength indicator (RSSI) value by converting the RF signal component of the selected signal by the selector into a direct voltage.

If the selector (485) selects the first signal (SF1) responsive to the first SWC from the controller (495), the detector (490) detects corresponding RSSI value for the selected first signal (SF1) and inputs the detected RSSI to the controller (495). Similarly, if the selector (485) selects the second signal (SF2) responsive to the second SWC from the controller (495), the detector (490) detects corresponding RSSI value for the second signal (SF2) and then sends it to the controller (495).

After the controller (495) compares and analyzes the RSSI value of the SF1 and the RSSI value of the SF2, the controller (495) generates corresponding the ATT1 and PIC1, and then provides each to the first attenuator (415) and the first phase shifter (420), respectively in order to equalize the amplitudes and the phases of the two output signals, one from the counter-balancing means (450) and the other from the predistorted signals from the baseband linear amplification arrangement (300).

Similarly, the regulated values of the second attenuator (455) and the second phase shifter (460) are controlled by the controller (495). The controller (495) provides two different SWC signals to the selector (485) for selecting the second (SF2) and the third (SF3) step by step. At first, the selector (485) selects the second signal (SF2) in response to a SWC signal transmitted from the controller (495), and then the detector (490) detects corresponding RSSI value for the second signal (SF2) and inputs it to the controller (495). The selector (485) also selects SF3 in response to another SWC signal transmitted from the controller (495), and the detector (490) detects corresponding RSSI value for the third signal (SF3) and inputs it to the controller (495). Thereafter, the controller (495) compares and analyzes the RSSI value of the SF2 with the RSSI value of the SF3 and for generating the ATT2 and PIC2, and then transmit them to the second attenuator (455) and the second phase shifter (460), respectively.

The second attenuator (455) adjusts the amplitude level of the RF signal responsive to the ATT2, and the second phase shifter (460) adjusts the phase of the RF signal in responsive to the PIC2. The second attenuator (455) and the second phase shifter (460) are adjusted to equalize the amplitudes and the phases of the two output signals, one from the second delay means (430) and the other the count-balancing means (450).

The signal outputted from the second phase shifter (460) is amplified by the error amplifier (465), and then the amplified error signal is transmitted to the combiner (470). The combiner (470) combines the distorted amplifier output signal via the second delay means (430) with the signal outputted from the error amplifier (465). The second delay means (470) serves to exactly synchronizing these two output signals when these two signals combined in the combiner (470). That is, the second delay means (470) delays the distorted amplifier output signal outputted from the main NLPA (425) in order to compensate the operation time of the second attenuator (455), the second phase shifter (460), and the error amplifier (465) so that the combines signals are synchronized.

When the count balance means (450) extracts only the error signal and the error signal is amplified to be subtracted from the distorted amplifier output signal in order to eliminate the distorted component of the amplifier output signal, the error signal from the count balance means (450) has to have the same amplitudes as the distorted amplifier output signal from the main NLPA (425) and also be out of phase with each other. The second attenuator (455) serves to equalize the amplitudes of SF2 and SF3, and the second phase shifter (460) makes the phases of SF2 and SF3 be out of phase. Consequently, the combiner (470) is able to output a pure carrierband signal free of any distortion. The undistorted carrierband signal outputted is illustrated in the graph (D) of the FIG. 7.

Figure 8:
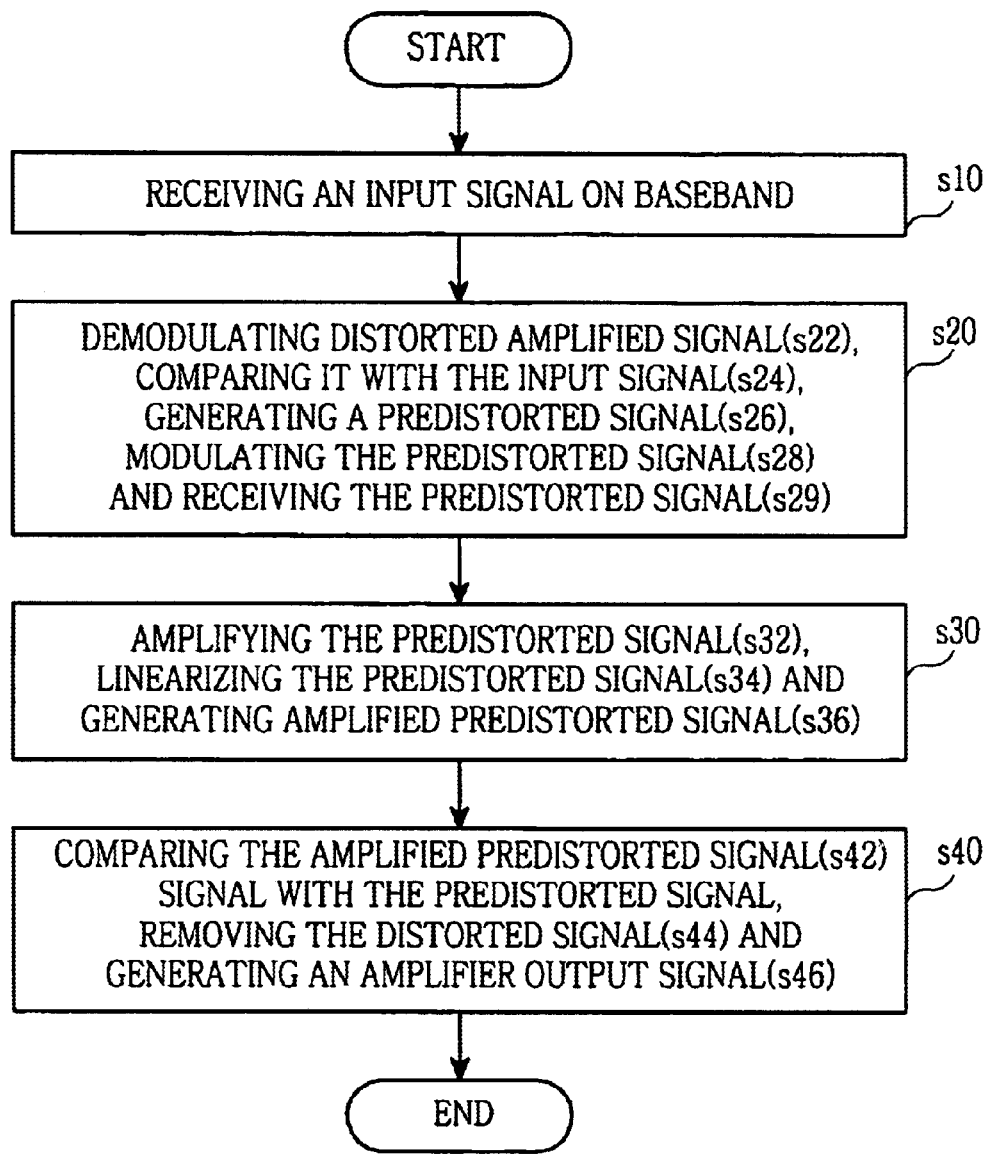
FIG. 8 illustrates a flow chart showing a preferred embodiment of a method for linearizing the distortion component of the power amplifier according to the present invention.

FIG. 8 illustrates a flow chart showing a preferred embodiment of a method for the linear power amplification according to the present invention. The method includes the steps of receiving an input signal on baseband (s10); demodulating distorted amplifier output signal from a non-linear power amplifier (NLPA) (s22) and comparing the demodulated signal with the input signal (s24); generating a predistorted signal for count-balancing the distorted amplifier output signal applied by the NLPA (s26); modulating the predistorted and the input signal (s28); receiving the predistorted signal (s29); amplifying the predistorted signal by the non-linear power amplifier (s32) and firstly linearizing the distorted component of the amplifier output signal on the baseband by the predistorted signal (s34); generating distorted amplified output signal by the NLPA (s36) and combining the distorted amplified output signal with a delayed predistorted signal (s42); removing the distortion component applied by the NLPA (s44); and, generating final amplifier output signal free of any distorted amplified signal (s46).

Figure 9:
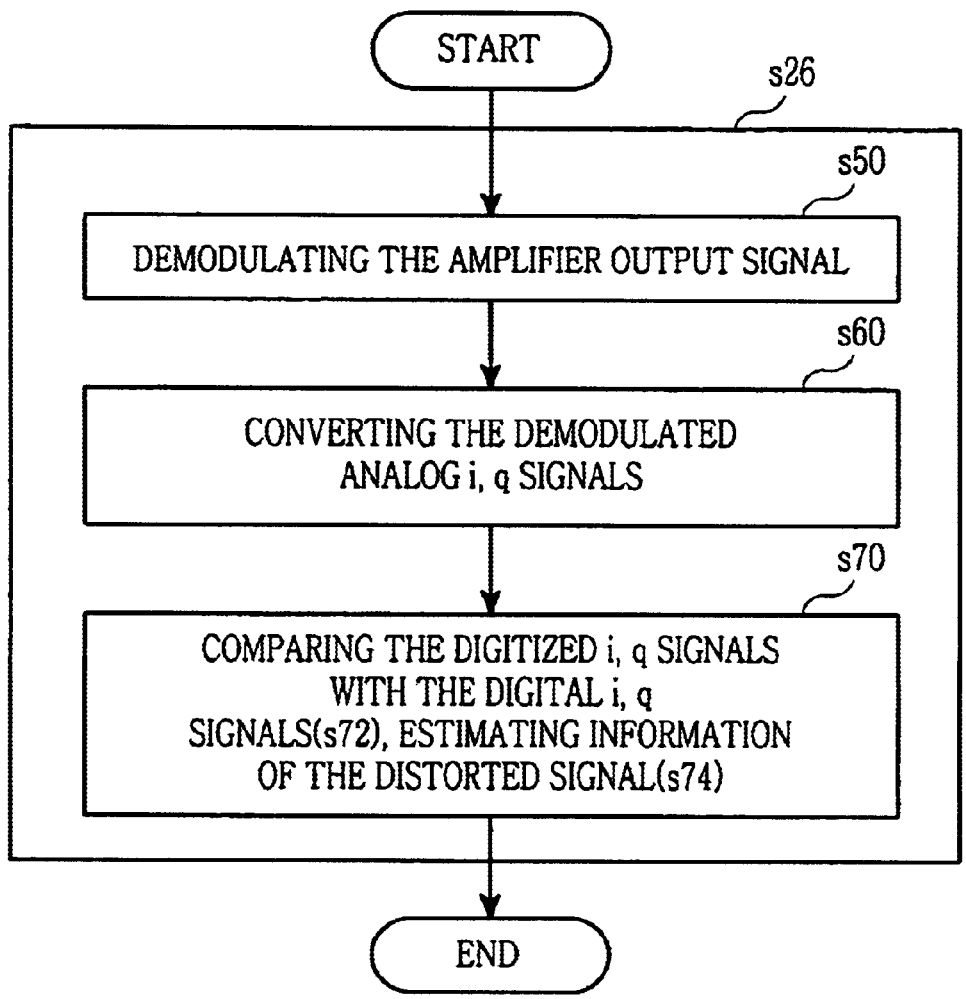
FIG. 9 illustrates a flow chart for generating an amplifier output signal (s26)

As shown in FIG. 9, the step (s26) of generating the predistorted signal indicative of the distorted component of the amplifier output signal further comprises the steps of demodulating the amplifier output signal from the NLPA into analog i, q signals by the local oscillate frequency (LOF) from a local oscillator (s50); converting the demodulated analog i, q signals into digital signal (s60); comparing the converted i, q signals with the digital i, q signals of the input signal prior to the modulation (s72); and, estimating information of the distorted signal (s74).

Figure 10:
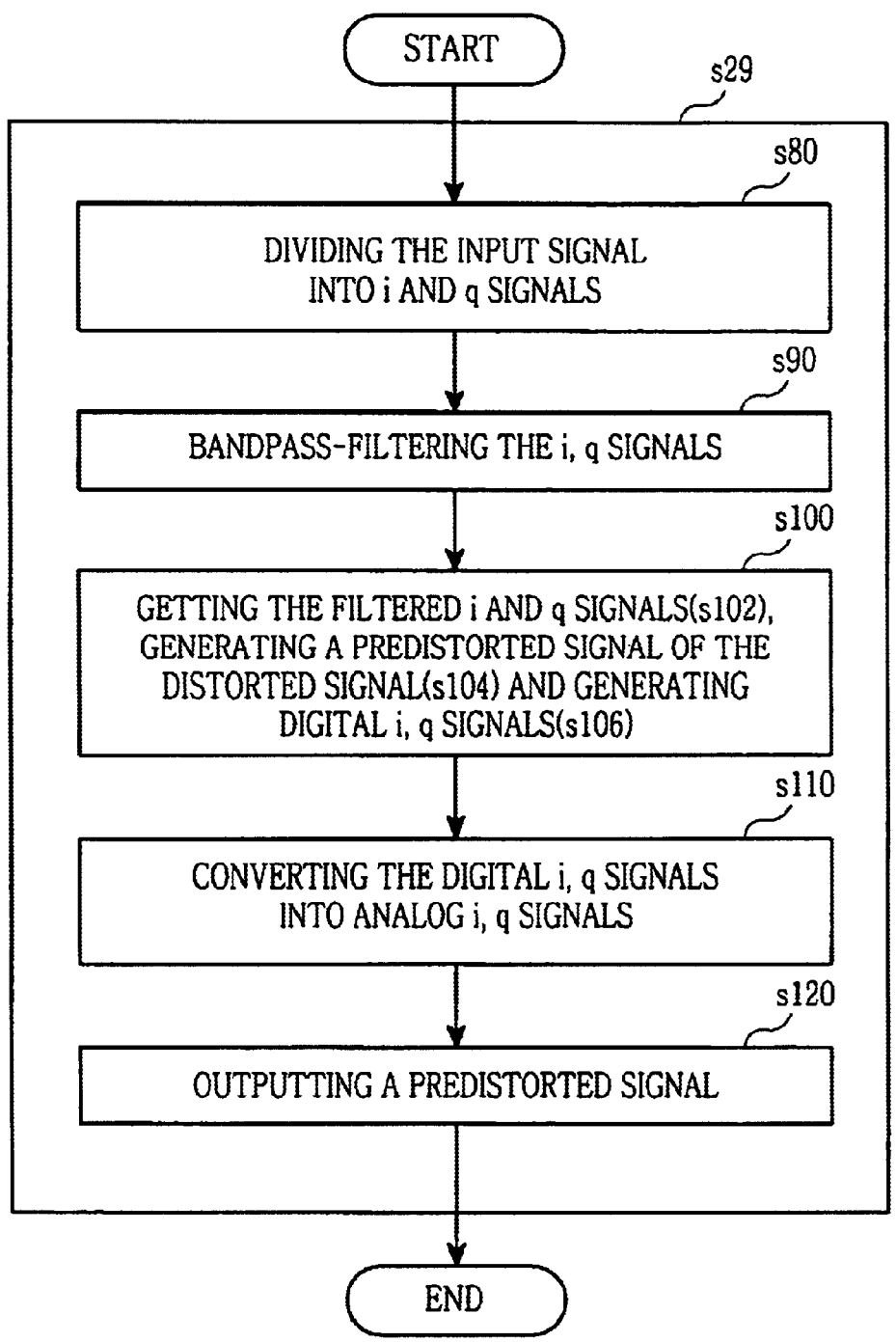
FIG. 10 illustrates a flow chart for generating a pre-distorted signal (s29)

As shown in FIG. 10, the step (s29) of generating the predistorted signal comprises the steps of: dividing the input signal from digital data source into i (in phase) and q (quadrature) signals (s80) using a quadrature phase shift keying (QPSK), bandpass-filtering the divided digital i and q signals (s90), supplying the filtered i and q signals and power capacity of the filtered i and q signals (s102) to a controller, generating the predistorted signal of the distorted signal by the controller (s104) and outputting the predistorted digital i and q signals (s106), converting the predistorted digital i and q signals into analog i and q signals; and, modulating the predistorted analog i, q signals using the local oscillating frequency from the local oscillator (LOF) (s110) and outputting as the predistorted signal (s120).

Figure 11:
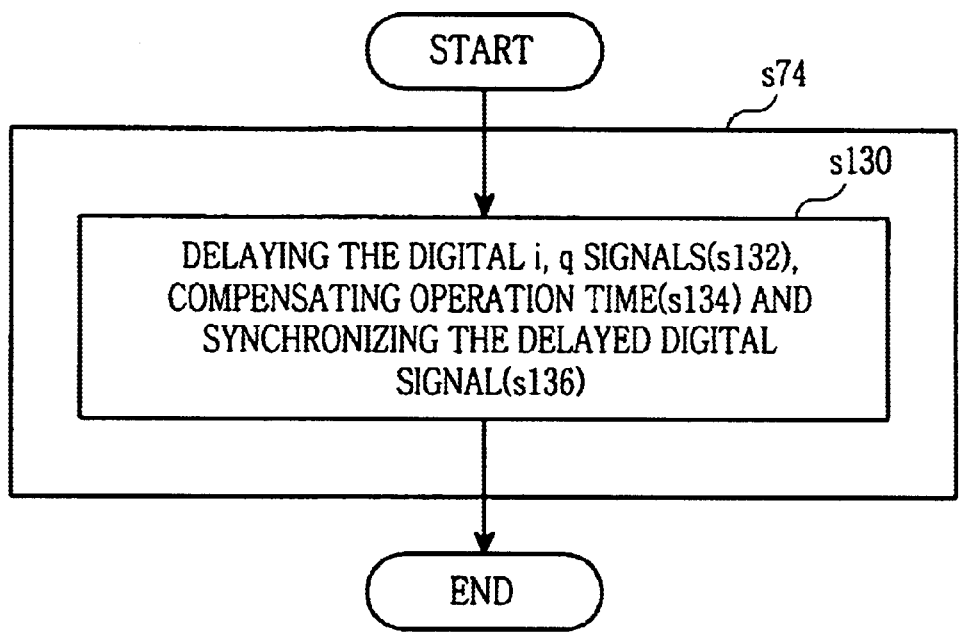
FIG. 11 illustrates a flow chart for estimating information on a distorted component of amplifier output signal (s74)

As shown in FIG. 11, the step (s74) of estimating the information further comprises the step of delaying the converted input digital i, q signals for compensating the operating time according to the demodulation and analog-digital conversion for synchronizing the delayed input digital signal with the converted digital signals by a A/D converter (s130).

Figure 12:
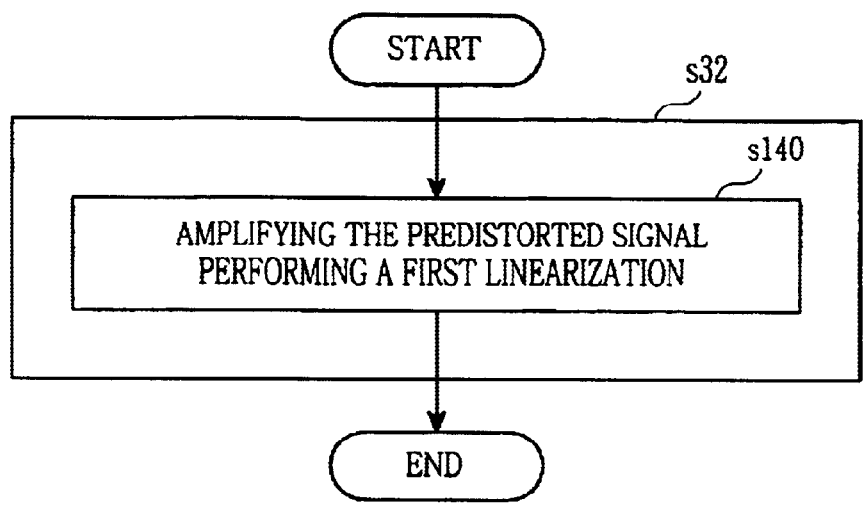
FIG. 12 illustrates a flow chart for linearizing a pre-distorted signal by amplifying the pre-distorted signal (s32)

As shown in FIG. 12, the step (s32) of amplifying the second input signal further comprises the step of amplifying the second signal including predistorted and performing a first linearization by the predistorted of the distorted signal (s140).

Figure 13:
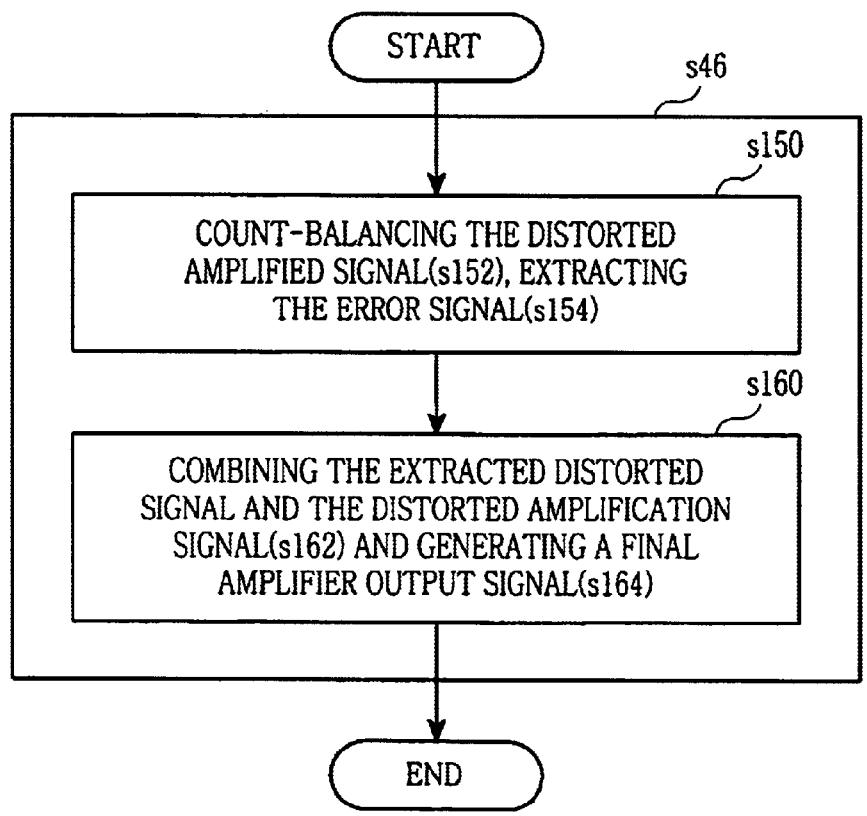
FIG. 13 illustrates a flow chart for generating an error signal and generating an amplifier output signal (s48)

As shown in FIG. 13, the step (s46) of generating the final amplifier output signal free of distorted signal further comprises the steps of count-balancing the distorted component of the amplifier output signal by a count-balancing means (s152), extracting an error (s154), amplifying the error signal, and combining the amplified error signal with the distorted amplifier output signal to be out of phase, and performing a second linearization (s162) by subtracting the amplified error signal from the distorted amplifier output signal to generate the final amplifier output signal (s164).

Figure 14:
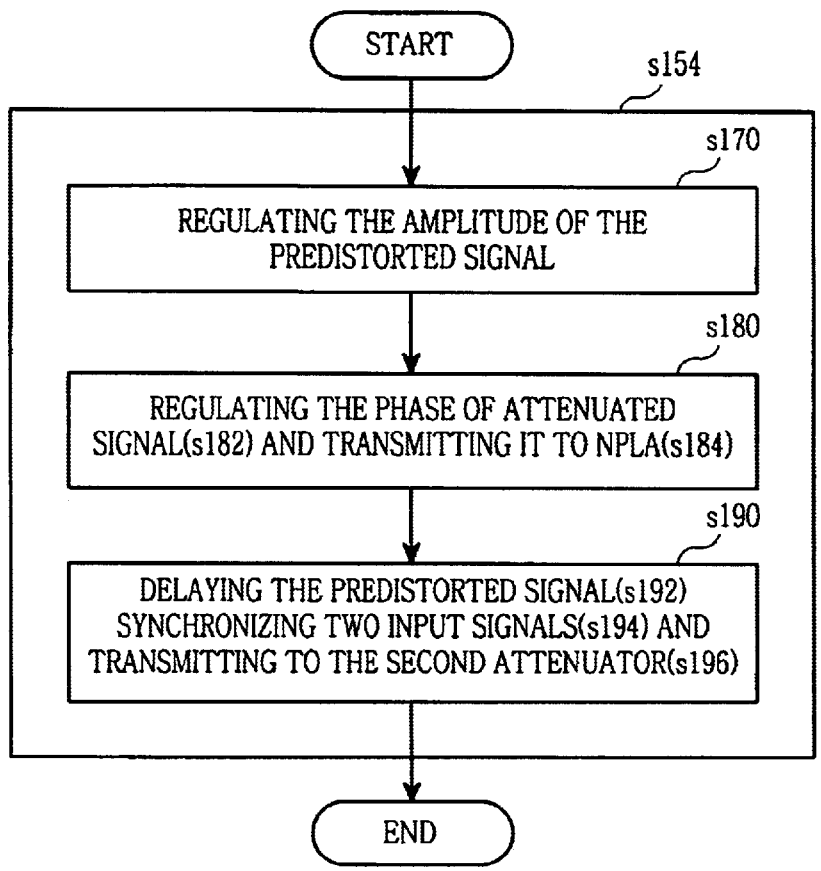
FIG. 14 illustrates a flow chart for extracting an error signal to generate the amplifier output signal.

As shown in FIG. 14, the step (s154) of extracting the error signal further comprises the steps of adjusting the amplitude of the predistorted signal in response to a first attenuation value (s170) by a first attenuator, adjusting the phase of the attenuated predistorted signal in response to a first phase value by a first phase-shifter to be out of phase with the delayed predistorted (s182), transmitting the output from the first phase shifter to the non-linear power amplifier (NPLA) (s184), delaying the predistorted signal (s192), synchronizing two signals inputted into the count-balancing means, one from the first delay means and the other from the distorted amplification signal from the NLPA (s194), and thereafter transmitting to a second attenuator (s196).

Figure 15:
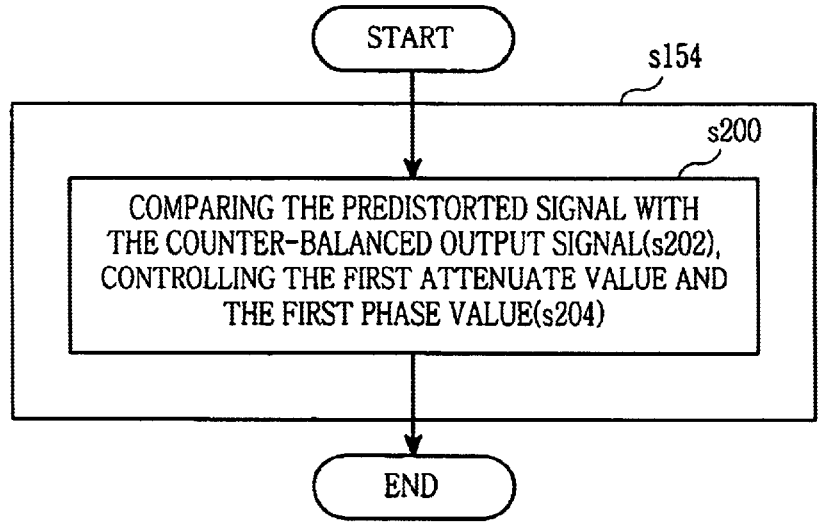
FIG. 15 illustrates a flow chart of a part of the step (s154) in generating an error signal.

As shown in FIG. 15, the step (s154) of extracting the error signal further comprises the step of comparing the predistorted signal with the counter-balanced output signal (s202) for producing the first attenuate value and the first phase value (s204) that are used to control the amplitude and phase of the predistorted input signal.

Figure 16:
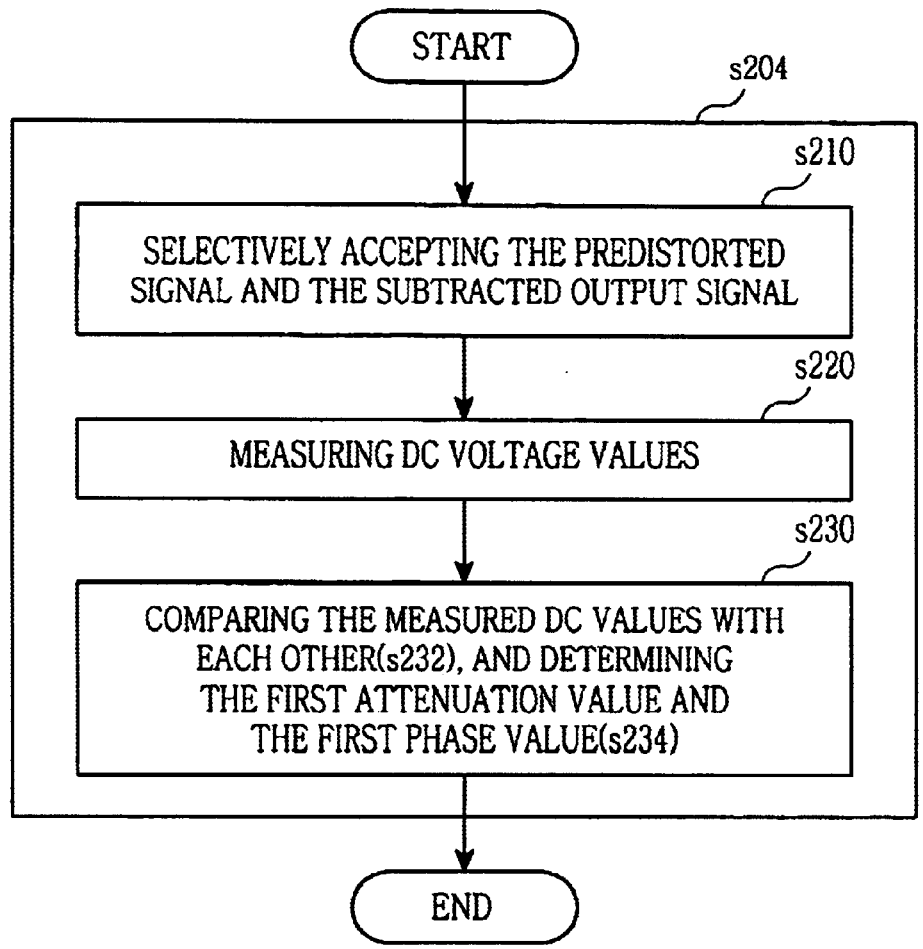
FIG. 16 illustrates a flow chart of controlling a first attenuation value and a first phase value as a part of the step for generating an error signal.

As shown in FIG. 16, the step (s204) of controlling the first attenuation value and the first phase value comprises the steps of selectively accepting the predistorted signal and the output signal from the counter-balancing means (s210), measuring DC voltage values for each selected signals, respectively (s220), comparing these two measured DC voltage values with each other (s232) for determining the first attenuation value and the first phase value (s234).

Figure 17:
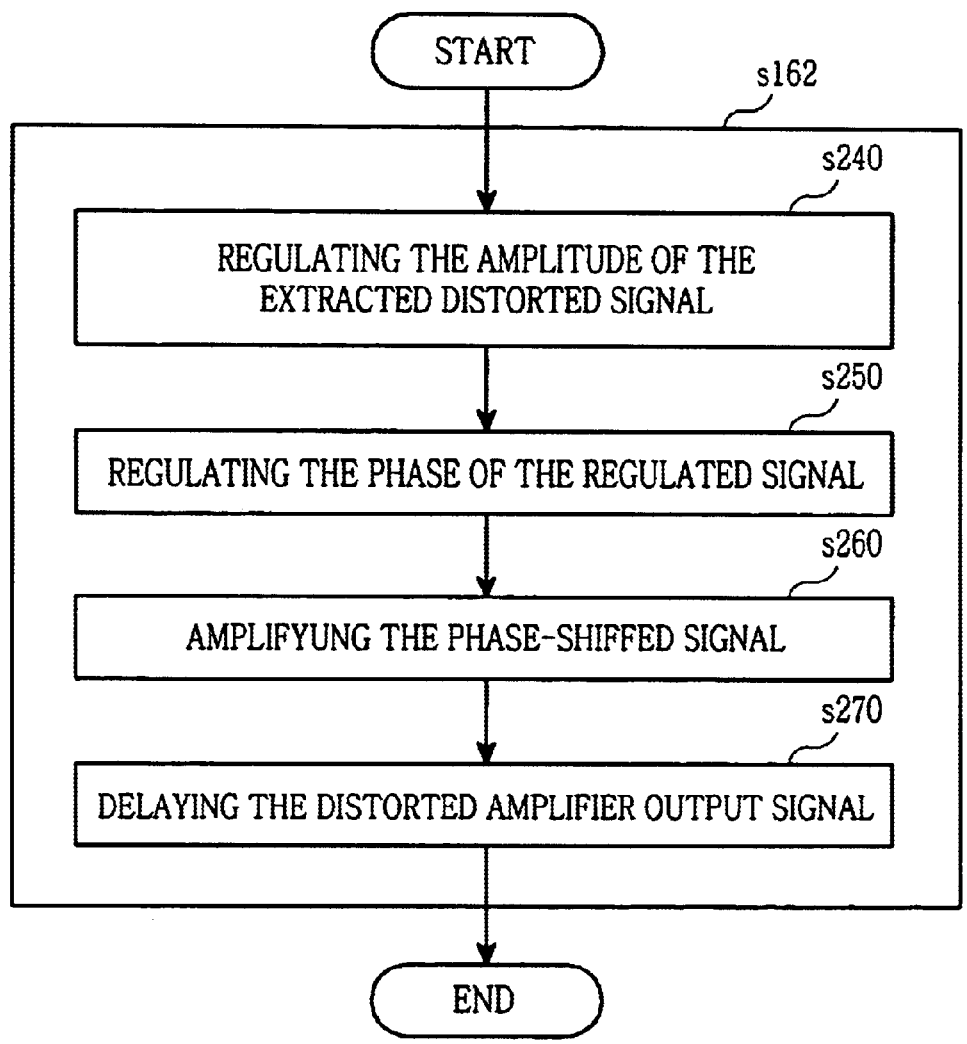
FIG. 17 illustrates a flow chart of combining the amplified error signal with the amplifier output signal.

As shown in FIG. 17, before combing the extracted error signal with the distorted amplifier output signal to be out of phase the step (s162), the method further comprises the steps of regulating the amplitude of the extracted error signal in response to a second attenuation value for regulating the amplitude of the two combined signals to be the same (s240), regulating the phase of the regulated signal in response to a second phase value to be out of phase (s250), amplifying the phase shifted signal (s260); delaying the distorted amplifier output signal to compensate for the operation time of the regulating the amplitude and the phase, and for synchronizing the delayed distorted amplifier output signal with the amplified error signal (s270).

Figure 18:
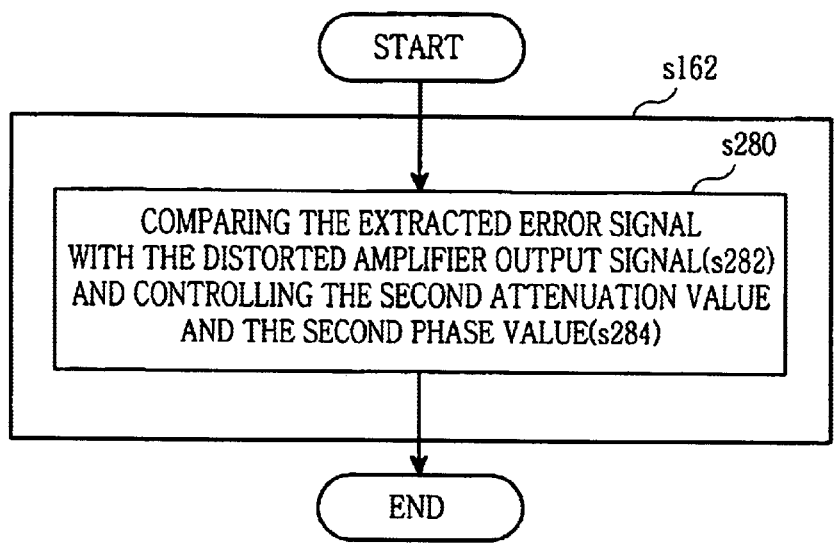
FIG. 18 illustrates a flow chart of a part of the step (s162) in the combining step as in FIG. 17; and, FIG. 19 illustrates a flow chart of controlling a second attenuation value and a second phase value.

As shown in FIG. 18, the step (s162) of combining the extracted error signal with the distorted amplifier signal further comprises the step of comparing the extract error signal from the counter-balance means with the amplifier output signal (s282) and for controlling the amplitude and phase of the error signal responsive to the second attenuation value and the second phase value (s284).

Figure 19:
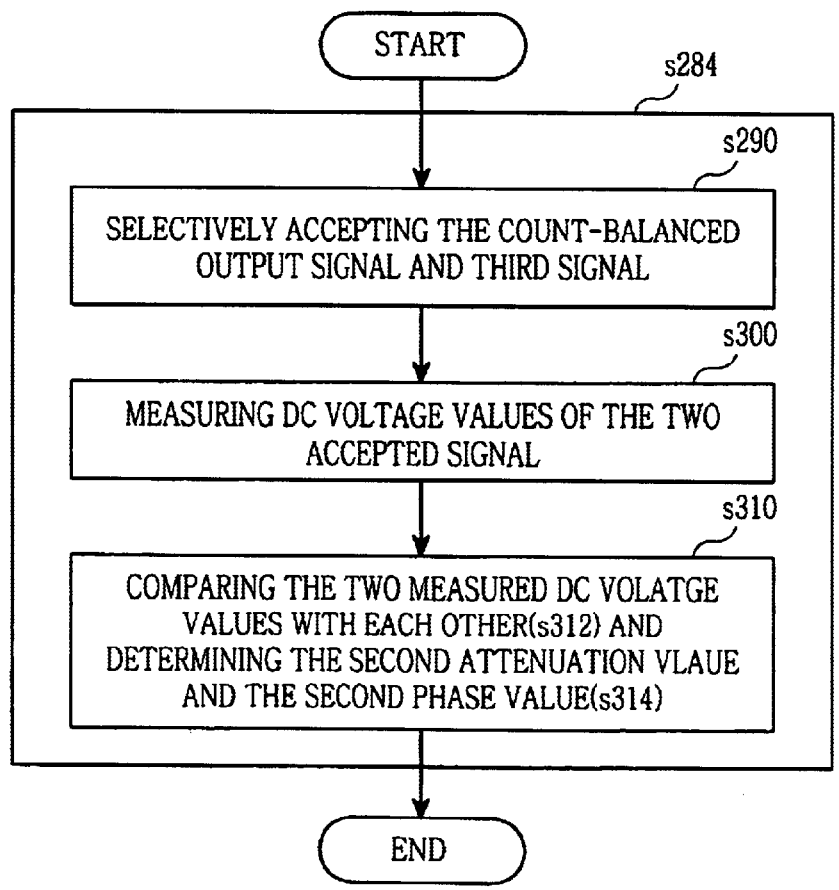

As shown in FIG. 19, the step (s284) of producing the second attenuation value and the second phase value further comprises the steps of selectively accepting the count-balanced output signal and the amplifier output signal (s290), measuring DC voltage values for each selected signal (s300), and comparing these two measured DC voltage values with each other (s312) for determining the second attenuation value and the second phase value (s314).

As described in the above, the advantage of a representative embodiment of the present invention as utilized in the telecommunication system using the digital modulation method, the present invention removes the distorted signal components in the RF signal. Thus, the present invention removes the interference within adjacent frequency channel and improves the demodulation feature on receiving-end, resulting in an improvement in the traffic's quality. By incorporating linearization of the baseband prior to linearization on the carrierband, the present invention combines the feed-forward technique and the digital predistorted technique, which would be very useful to the digital telecommunication system.

While the invention is susceptible to various modification and alternative forms, specific embodiments thereof have been shown by way of example in the drawings and detected description. It should be understood, however, that the present invention is not limited to the particular forms disclosed, but on the contrary, the intention is to cover all modifications, equivalents, and alternative falling within the spirit and scope of the invention as defined by the appended claims.

What is claimed is:

1. An apparatus for eliminating an amplified distortion signal component from the output of a non-linear power amplifier, comprising:

a baseband linearization arrangement for generating and modulating to radio frequency (RF) a predistorted signal before said predistorted signal is fed to said power amplifier to produce an RF amplified distortion signal, said predistorted signal being generated by demodulating said RF amplified distortion signal to produce a demodulated distortion signal and then comparing said demodulated distortion signal with said predistorted signal; and a carrierband amplification arrangement, including said power amplifier, for amplifying the modulated predistorted signal from said baseband arrangement to linearize a resulting RF amplified distortion signal, and for further linearizing said RF amplified distortion signal by comparing said RF amplified distortion signal with a delayed modulated predistorted signal to obtain an error signal, amplifying said error signal to produce an amplified error signal, and subtracting said amplified error signal from said RF amplified distortion signal.

2. The apparatus as set forth in claim 1, wherein said baseband linearization arrangement modulates said predistorted signal using a quadrature phase shift keying (QPSK) apparatus.

3. The apparatus as set forth in claim 1, wherein said baseband linearization arrangement comprises:

a digital encoder for dividing said power amplifier into first digital i and q signals;

a filter coupled to said encoder for filtering the divided i and q signals; and an absolute detector for measuring the absolute value of amplitude of the filtered i and q signals.

4. The apparatus as set forth in claim 3, wherein said baseband linearization arrangement comprises:

a predistorter for generating said predistorted signal from said filtered i and q signals;

a digital-to-analog-converter coupled to said predistorter for converting said i and q signals from said predistorter into corresponding analog i and q signals; and a modulator coupled to said digital-to-analog converter for modulating said analog i and q signals using a local oscillator.

5. The apparatus as set forth in claim 4, wherein said predistorter comprises a look up table including a plurality of predetermined predistorted signals.

6. The apparatus as set forth in claim 1, wherein said baseband linearization arrangement comprises:

a digital encoder for dividing said power amplifier digital i and q signals;

a filter coupled to said encoder for filtering the divided i and q signals;

an absolute detector for measuring the absolute value of amplitude of the filtered i and q signals;

a predistorter for generating said predistorted signal from the filtered i and q signals;

a digital-to-analog-converter coupled to said predistorter for converting i and q components of said predistorted signal into corresponding analog i and q signals; and a modulator coupled to said digital-to-analog converter for modulating said corresponding analog i and q signals using a local oscillator.

7. The apparatus as set forth in claim 6, wherein said predistorter further comprises a look up table including a plurality of predetermined predistorted signals.

8. The apparatus as set forth in claim 7, wherein said baseband linearization arrangement further comprises:

demodulator for demodulating said amplified distortion signal using local oscillating frequencies from said local oscillator into corresponding analog i and q signals;

an analog-to-digital converter for converting the demodulated analog i and q signals into corresponding digital i and q signals; and an estimator for comparing said corresponding digital i and q signals to said i and q components of said predistorted signal to provide an address for said look up table.

9. The apparatus as set forth in claim 6, wherein said baseband linearization arrangement further comprises:

a demodulator for demodulating said amplified distortion signal using local oscillating frequencies from said local oscillator into corresponding analog i and q signals;

an analog-to-digital converter for converting said corresponding analog i and q signals into corresponding second digital i and q signals; and an estimator for comparing said demodulated distortion signal and said predistorted signal.

10. The apparatus as set forth in claim 9, wherein said baseband linearization arrangement further comprises a baseband delay means coupled to said estimator for delaying said predistorted signal to compensate for delays introduced by operating time of said demodulator and said analog-to-digital converter.

11. The apparatus as set forth in claim 1, wherein said carrierband linear amplification arrangement comprises:

a comparison loop having a counter-balancing means for generating said error signal by comparing said output of said power amplifier with said delayed predistorted signal; and a compensation loop having a secondary amplifier for amplifying said error signal and combining means for combining the amplified error signal with said output of said power amplifier.

12. The apparatus as set forth in claim 11, said apparatus further comprising:

a selector coupled to selectively receive, in response to a control signal, said predistorted signal from said baseband linearization arrangement, said error signal, and a signal representative of said output of said power amplifier;

a detector serving to measure, in response to a detection control signal, power value of the selected signal; and a controller for controlling operation of said selector and said detector by generating said control signal and said detection control signal and for generating a pair of a first attenuation value and a first phase shift value, and a pair of a second attenuation value and a second phase shift value based on two measured power values from said detector.

13. The apparatus as set forth in claim 12, wherein said comparison loop further comprises:

a first attenuator for adjusting an amplitude of said predistorted signal responsive to said first attenuation value, a first phase shifter coupled to said first attenuator for adjusting a phase of an output signal from said first attenuator responsive to said first phase shift value, a first delay means for delaying said predistorted signal to compensate for operation time of said first attenuator and said first phase shifter in order to be synchronized with said output of said power amplifier.

14. The apparatus as set forth in claim 12, wherein said compensation loop further comprises:

a second attenuator for adjusting an amplitude of said error signal responsive to said second attenuation value;

a second phase shifter for adjusting a phase of an output signal from said second attenuator responsive to said second phase value; and a second delay means coupled to said output of said power amplifier for delaying said predistorted signal to compensate for delays introduced by operating time of said second attenuator, said second phase shifter, and said secondary amplifier.

15. A method for eliminating an amplified distortion component from the output of a power amplifier, said method comprising the steps of:

storing a plurality of pre-determined predistorted signals in a look up table;

receiving an amplifier input signal;

modulating said amplifier input signal to radio frequency (RF);

amplifying the RF amplifier input signal to generate an RF amplifier output signal;

demodulating said amplifier output signal;

using feedback to generate a predistorted signal from said look up table by comparing said demodulated amplifier output signal with said predistorted signal;

amplifying the modulated predistorted signal to linearize said RF amplifier output signal;

generating an error signal by combining said RF amplifier output signal with said modulated predistorted signal;

amplifying said error signal and combining the amplified error signal with said RF amplifier output signal to eliminate distortion characteristics in said RF amplifier output signal.

16. The method as set forth in claim 15, wherein said predistorted signal is delayed for a finite time before combining with said amplifier output signal.

17. The method as set forth in claim 16, wherein said amplifier output signal is delayed for a finite time before combining with said amplified error signal.

18. The method of claim 16, wherein the step of modulating said amplifier input signal incorporates a known quadrature phase shift keying (QPSK) method.

19. The method as set forth in claim 15, wherein said receiving of the amplifier input signal is from a digital data source and wherein the step of modulating said amplifier input signal further comprises the steps of:

dividing said amplifier input signal into digital i and q signals;

bandpass-filtering the divided digital i and q signals;

converting the filtered digital i and q signals into analog i and q signals; and modulating the converted analog i, q signals using a local oscillator.

20. The method as set forth in claim 15, wherein the step of generating said predistorted signal further comprises the steps of:

converting the demodulated amplifier output signal into digital i and q signals using a local oscillator; and retrieving said predistorted signal from said look up table by comparing the converted digital i and q signals with delayed predistorted digital i and q signals.

21. The method of claim 15, wherein said step of generating the error signal further comprises the steps of:

selectively receiving said predistorted signal and said amplifier output signal;

measuring a DC voltage value for the selected predistorted signal and amplifier output signal; and comparing the measured voltage values to generate a first attenuation value and a first phase value, wherein said first attenuation value and said first phase value are used to synchronize said amplifier output signal with said predistorted signal.

22. The method of claim 21, wherein the step of generating the error signal further comprises the steps of:

adjusting an amplitude of said predistorted signal responsive to said first attenuation value; and adjusting a phase of said predistorted signal responsive to said first phase value.

23. The method as set forth in claim 15, wherein the step of amplifying said error signal further comprises the steps of:

selectively receiving said error signal and said amplifier output signal;

measuring DC voltage value for the selected error signal and amplifier output signal; and comparing the measured voltage values to generate a second attenuation value and a second phase value, wherein said second attenuation value and said second phase value are used to synchronize said amplifier output signal with said error signal.

24. The method as set forth in claim 23, wherein the step of amplifying said error signal further comprises the steps of:

adjusting an amplitude of said error signal responsive to said second attenuation value; and adjusting a phase of said error signal responsive to said second phase value.

* * * * *